United States Patent
Huang et al.

(10) Patent No.: US 8,378,987 B2
(45) Date of Patent: Feb. 19, 2013

(54) SENSING METHOD AND CIRCUIT FOR A CAPACITIVE TOUCH PANEL

(75) Inventors: Chun-Chung Huang, Hsinchu (TW); I-Shu Lee, Keelung (TW); Hsiu-Ju Yang, Taichung (TW); Ching-Chung Wang, Hsinchu (TW); Kun-Ming Tsai, Hsinchu (TW); Yu-Hui Lin, Dajia Township, Taichung County (TW)

(73) Assignee: Elan Microelectronics Corporation, Hsinchu (TW)

( * ) Notice: Subject to any disclaimer, the term of this patent is extended or adjusted under 35 U.S.C. 154(b) by 426 days.

(21) Appl. No.: 12/836,016

(22) Filed: Jul. 14, 2010

(65) Prior Publication Data
US 2011/0012862 A1 Jan. 20, 2011

(30) Foreign Application Priority Data
Jul. 16, 2009 (TW) ............................... 98124097 A

(51) Int. Cl.
*G06F 3/041* (2006.01)

(52) U.S. Cl. ..... 345/173; 345/156; 345/174; 178/18.06; 178/18.07; 200/600; 341/33; 341/20; 463/37

(58) Field of Classification Search .................. 345/156, 345/173, 174, 178; 178/18.01–18.07; 463/37–38; 200/600; 341/20, 33
See application file for complete search history.

(56) References Cited

U.S. PATENT DOCUMENTS

| | | | |
|---|---|---|---|
| 2004/0104826 A1* | 6/2004 | Philipp | 341/34 |
| 2010/0073323 A1* | 3/2010 | Geaghan | 345/174 |

\* cited by examiner

*Primary Examiner* — Lun-Yi Lao
*Assistant Examiner* — Md Saiful A Siddiqui
(74) *Attorney, Agent, or Firm* — Rosenberg, Klein & Lee

(57) ABSTRACT

A sensing method for a capacitive touch panel includes charging a measure capacitor, setting the voltage across a mutual capacitor at the intersection of two traces of the capacitive touch panel, and then injecting partial charges of the measure capacitor into the mutual capacitor. When the intersection is touched, the capacitance value of the mutual capacitor is changed, and consequently the amount of charges injected into the mutual capacitor is changed. Hence, the voltage of the measure capacitor could be detected to determine whether or not the intersection is touched.

8 Claims, 17 Drawing Sheets

SENSING METHOD AND CIRCUIT FOR A CAPACITIVE TOUCH PANEL

FIELD OF THE INVENTION

The present invention is related generally to capacitive touch panels and, more particularly, to a sensing circuit and method for a capacitive touch panel.

BACKGROUND OF THE INVENTION

Capacitive touch panels are advantageously thin and light and therefore have gradually replaced the traditional input devices, such as keyboards and mice. As shown in FIG. 1, a conventional two-dimensional capacitive touch panel 10 includes X-axis traces TX1-TX8 and Y-axis traces TY1-TY6. Currently, the touch sensing of the capacitive touch panel 10 is carried out by measuring the self capacitance. For example, when a finger touches a position 12 on the capacitive touch panel 10, the capacitance values of the traces TX8 and TY3 are changed, so it can determine that the finger is at the intersection 12 of the traces TX8 and TY3. However, in multi-touch applications, the sensing method described above is unable to identify the touch points correctly. In FIG. 2, for example, two fingers simultaneously touching the positions 20 and 22 of the capacitive touch panel 10 will change the capacitance values of the traces TX2, TX4, TY2 and TY4, from which there could be sensed two possible pairs of touch points, one of real points 20 and 22, i.e., the positions (TX2, TY4) and (TX4, TY2) where the fingers actually touch, and the other of ghost points 24 and 26, namely positions (TX2, TY2) and (TX4, TY4). This causes the capacitive touch panel 10 unable to properly identify the real points 20 and 22.

FIG. 3 is a circuit diagram of a conventional sensing circuit 30 for a capacitive touch panel, in which a voltage source 32 provides a source voltage Vs applied to a trace TXN of the capacitive touch panel, a switch SW1 is connected between a trace TYM of the capacitive touch panel and a capacitor CL, and a switch SW2 is connected in parallel to the capacitor CL. The switches SW1 and SW2 control charging and discharging of the capacitor CL. When the switch SW1 is on and the switch SW2 is off, in response to the source voltage Vs, the mutual capacitor Cm at the intersection of the traces TXN and TYM will generate a current $$I = Cm \times dVs/dt \quad \text{[Eq-1]}$$

to charge the capacitor CL to generate a voltage VA, which is converted into a digital signal VD by an analog-to-digital converter 34, and a comparator 36 compares the digital signal VD with a threshold value TH to generate a sensing signal ST to determine whether or not the intersection of the traces TXN and TYM is touched. When the intersection of the traces TXN and TYM is touched, the capacitance value of the mutual capacitor Cm is increased and according to the equation Eq-1, an increase in the capacitance value of the mutual capacitor Cm results in an increase in the current I, which accelerates the rising of the voltage VA and consequently renders the digital signal VD higher than the threshold value TH. Although the foregoing sensing method, which is based on the use of the mutual capacitor Cm, can solve the problem of ghost points in multi-touch applications, it is disadvantageous in that the duration for which the switch SW1 is on, i.e., the on-time of the switch SW1, is under stringent restriction. If the on-time of the switch SW1 is slighter longer than it should be, the digital signal VD may turn higher than the threshold value TH and lead to misjudgment. However, it is extremely difficult to precisely control the on-time of the switch SW1 each time it is turned on.

SUMMARY OF THE INVENTION

An object of the present invention is to provide a sensing circuit and method for a capacitive touch panel.

Another object of the present invention is to provide a sensing circuit and method to identify the real points by a mutual capacitor.

According to the present invention, a sensing circuit for a capacitive touch panel having a first trace and a second trace with a mutual capacitor at the intersection thereof, includes a measure capacitor having two ends, the first one of which is connected to the second trace, a first switch connected between a first voltage node and the first trace, a second switch connected between the first voltage node and the second trace, a third switch connected between the first trace and a second voltage node, a fourth switch connected between the second end of the measure capacitor and the second voltage node, a measure unit connected to the measure capacitor to determine whether or not the intersection is touched according to the voltage of the measure capacitor, and a control unit to switch the first, second, third and fourth switches.

According to the present invention, a sensing circuit for a capacitive touch panel having a first trace and a second trace with a mutual capacitor at the intersection thereof, includes a measure capacitor having a first end and a second end, a first switch connected between a first voltage node and the first trace, a second switch connected between the first voltage node and the first end of the measure capacitor, a third switch connected between the first trace and a second voltage node, a fourth switch connected between the second end of the measure capacitor and the second voltage node, a fifth switch connected between the first voltage node and the second trace, a sixth switch connected between the second trace and the second voltage node, a seventh switch connected between the second trace and the first end of the measure capacitor, a measure unit connected to the measure capacitor to determine whether or not the intersection is touched according to the voltage of the measure capacitor, and a control unit to switch the first, second, third, fourth, fifth, sixth and seventh switches.

According to the present invention, a sensing method for a capacitive touch panel having a first trace and a second trace with a mutual capacitor at the intersection thereof, includes charging a measure capacitor, setting the voltage across the mutual capacitor, injecting charges of the measure capacitor into the mutual capacitor, and detecting the voltage of the measure capacitor to determine whether or not the intersection is touched.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
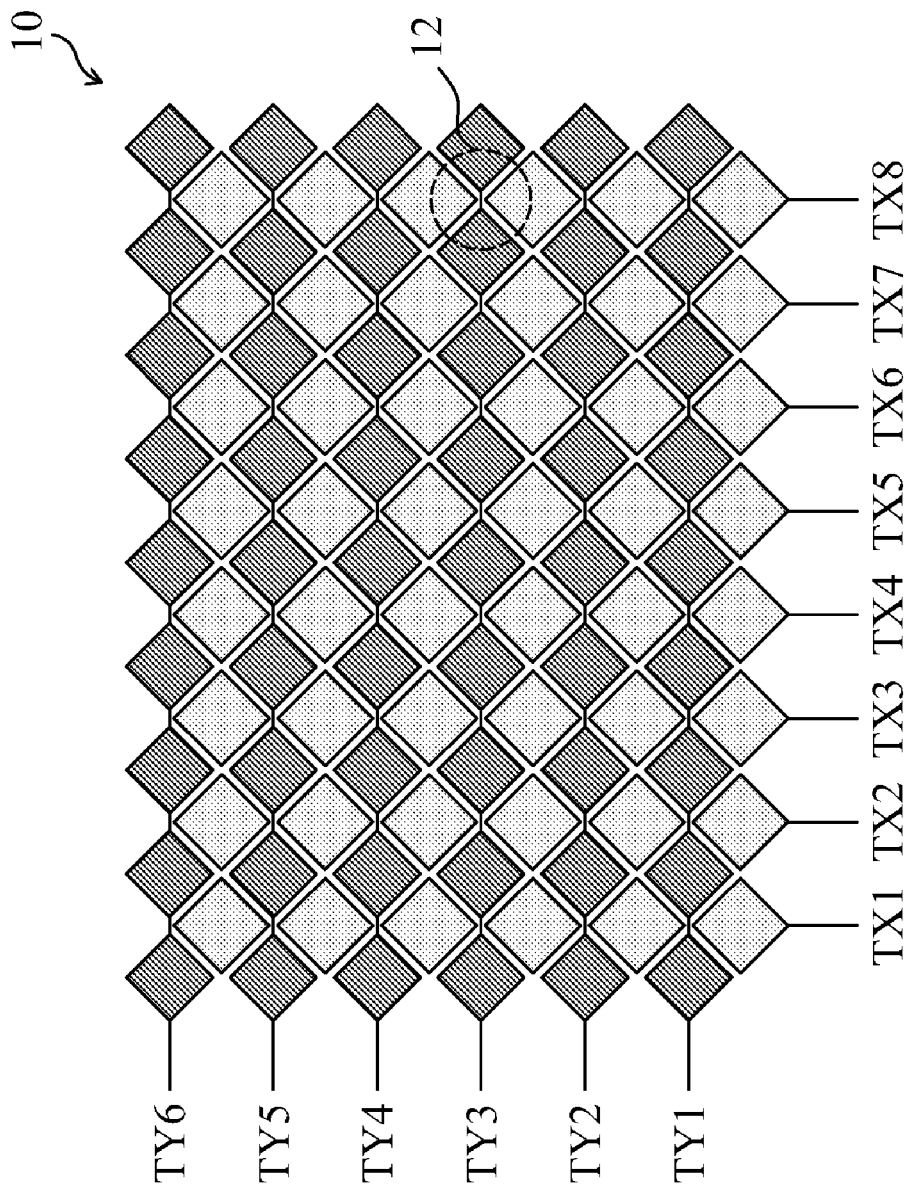
FIG. 1 is a schematic diagram of a conventional capacitive touch panel.
Figure 2:
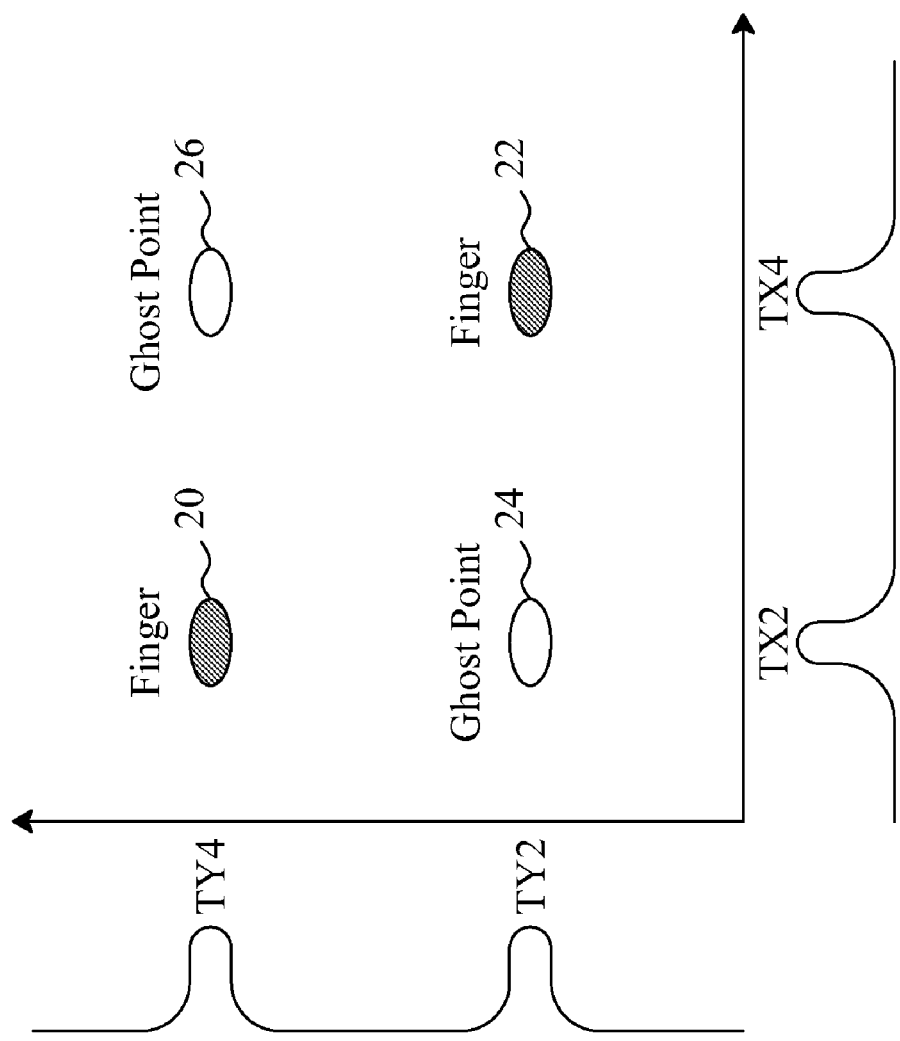
FIG. 2 is a schematic diagram of a two-finger application to the capacitive touch panel shown in FIG. 1.
Figure 3:
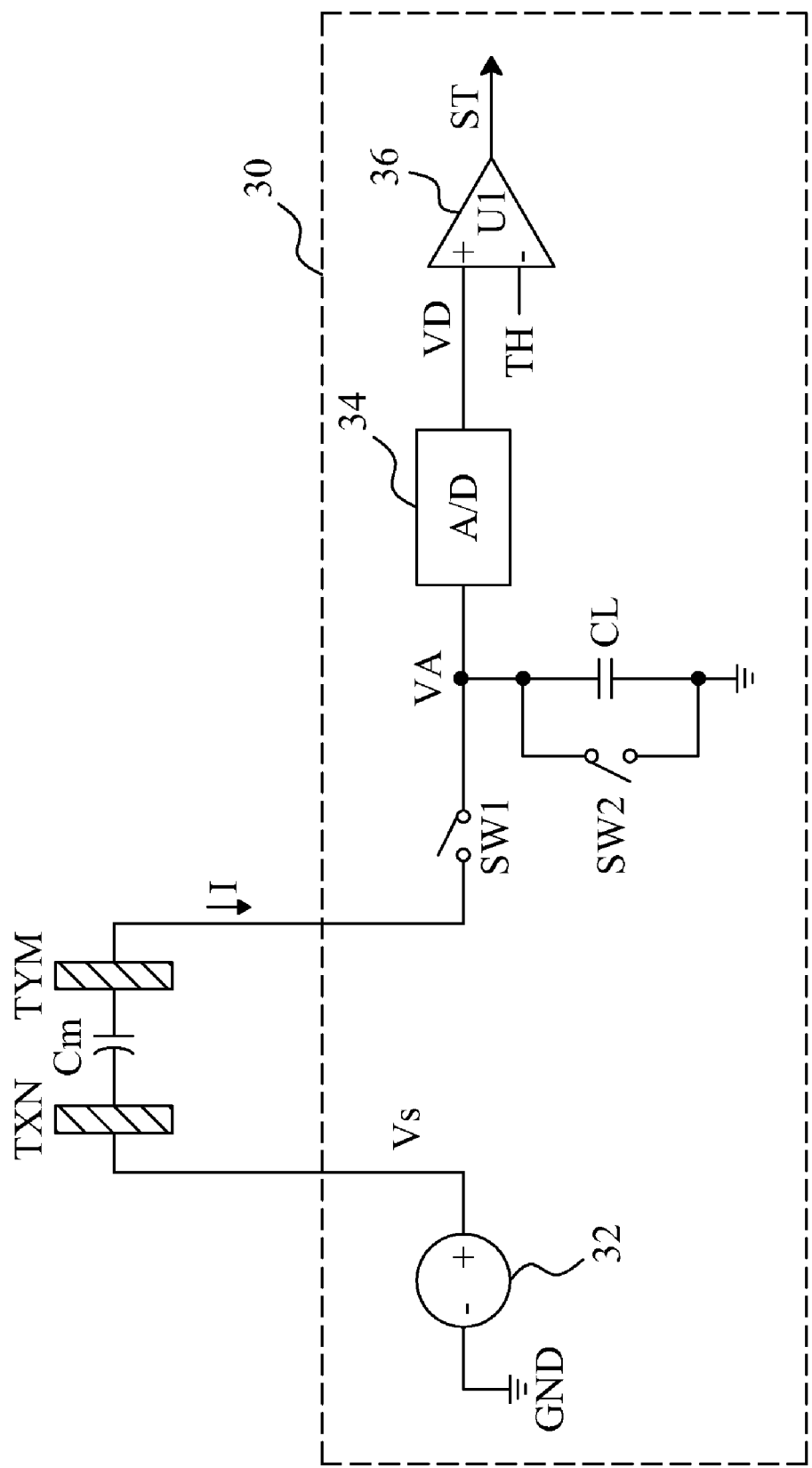
FIG. 3 is a circuit diagram of a conventional sensing circuit for a capacitive touch panel.
Figure 4:
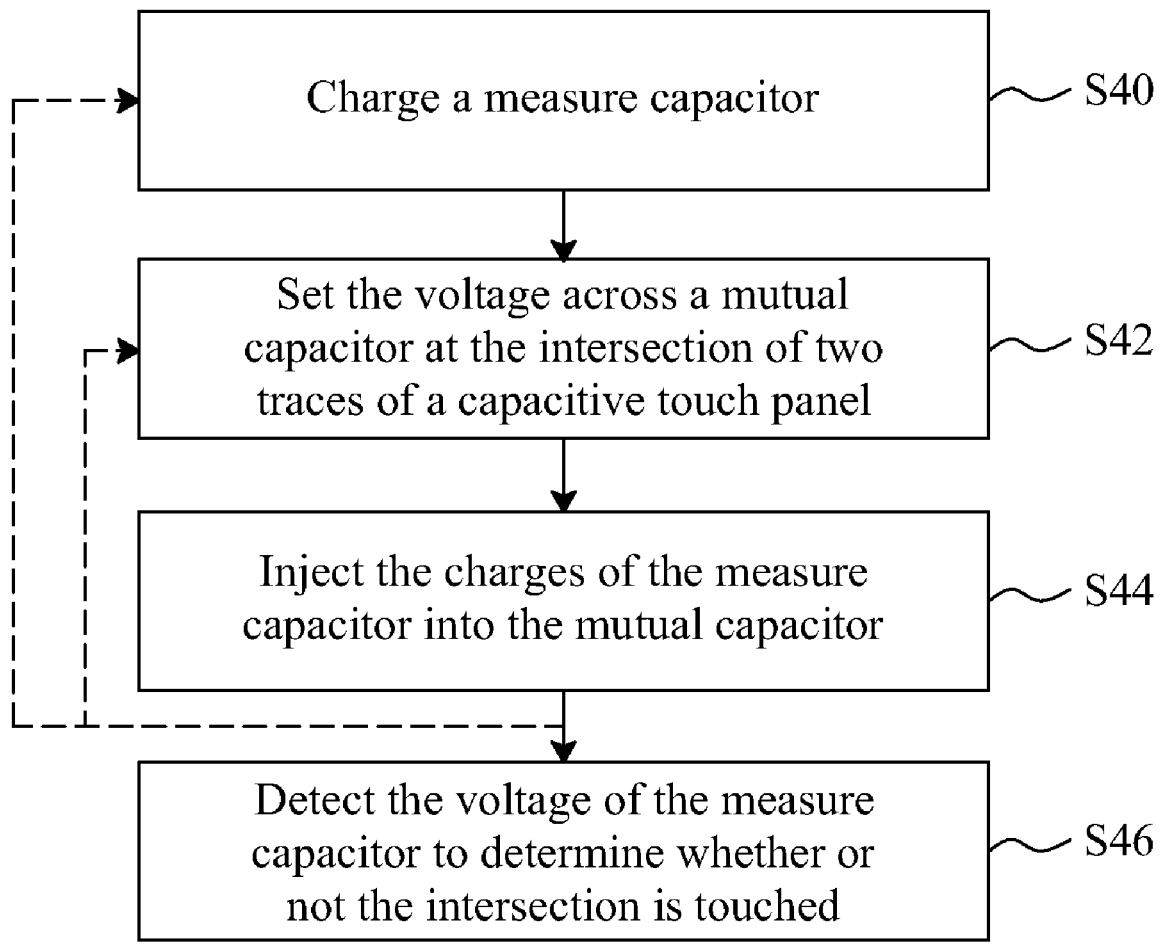
FIG. 4 is a flowchart of a sensing method according to the present invention.

FIG. 4 is a flowchart of a sensing method according to the present invention. To begin with, a measure capacitor is charged at step S40, and then, at step S42, it is set the voltage across the mutual capacitor at the intersection of two traces of a capacitive touch panel. Following that, let the measure capacitor charge the mutual capacitor at step S44, by which the charges in the measure capacitor are partially injected into the mutual capacitor and the voltage of the measure capacitor drops down. If the intersection of the two traces is touched, the capacitance value of the mutual capacitor will be changed, and the change in the capacitance value of the mutual capacitor will affect the amount of charges injected from the measure capacitor into the mutual capacitor. Therefore, the voltage of the measure capacitor could be detected at step S46 to determine whether or not the intersection is touched. In other embodiments, steps S42 and S44 or steps S40 through S44 can be repeated at least once before the voltage of the measure capacitor is detected at step S46.

Figure 5:
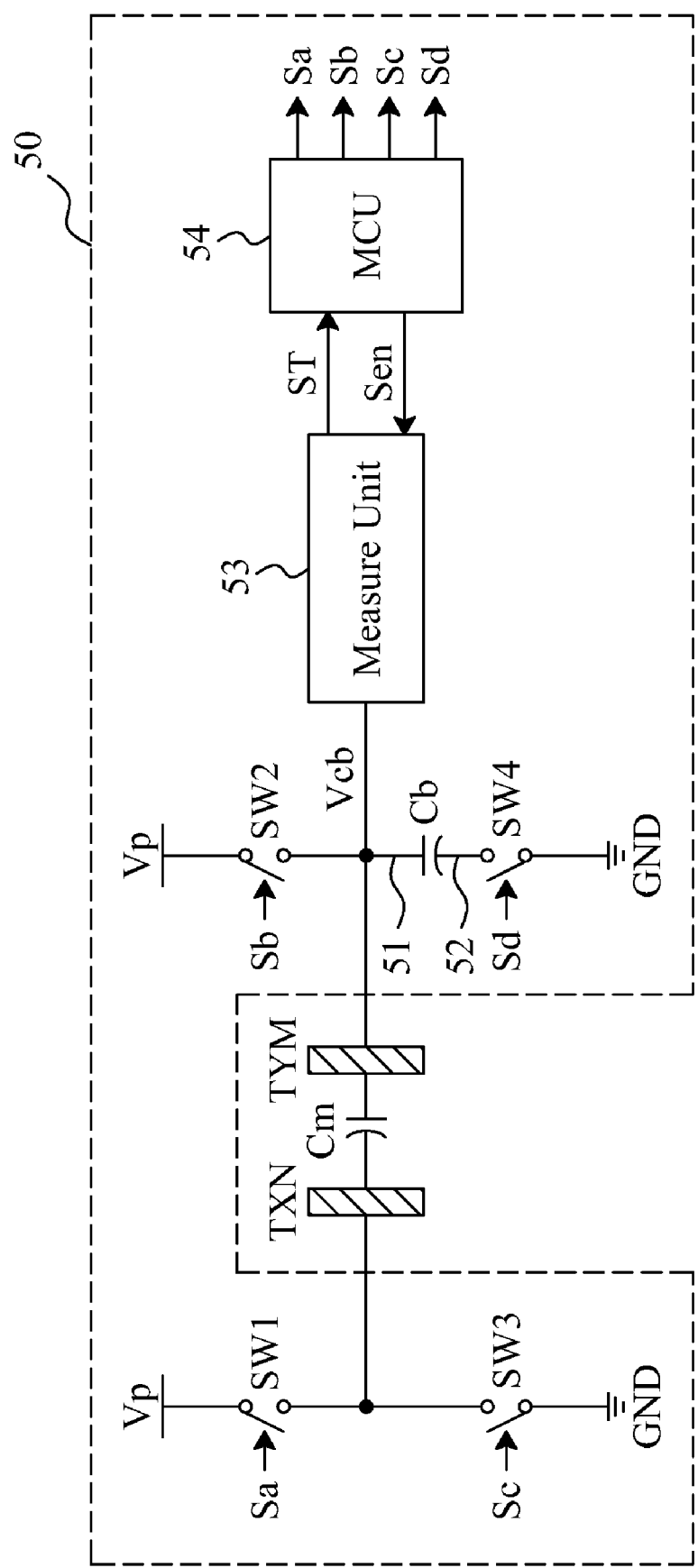
FIG. 5 is a circuit diagram of a first embodiment to carry out the sensing method according to the present invention.

FIG. 5 is a circuit diagram of a first embodiment to carry out the sensing method according to the present invention, in which a sensing circuit 50 is connected to traces TXN and TYM of a capacitive touch panel to detect the capacitance variation of the mutual capacitor Cm at the intersection of the traces TXN and TYM. The sensing circuit 50 includes switches SW1, SW2, SW3 and SW4, a measure capacitor Cb, a measure unit 53, and a microprocessor control unit (MCU) 54. The measure capacitor Cb has a first end 51 connected to the trace TYM, the switch SW1 is connected between a voltage node receiving a source voltage Vp and the trace TXN, the switch SW2 is connected between the voltage node Vp and the trace TYM, the switch SW3 is connected between the trace TXN and a ground node GND, the switch SW4 is connected between a second end 52 of the measure capacitor Cb and the ground node GND, the measure unit 53 is configured to detect the voltage Vcb of the measure capacitor Cb, and the MCU 54 provides control signals Sa, Sb, Sc and Sd for switching the switches SW1, SW2, SW3 and SW4, respectively.

Figure 6:
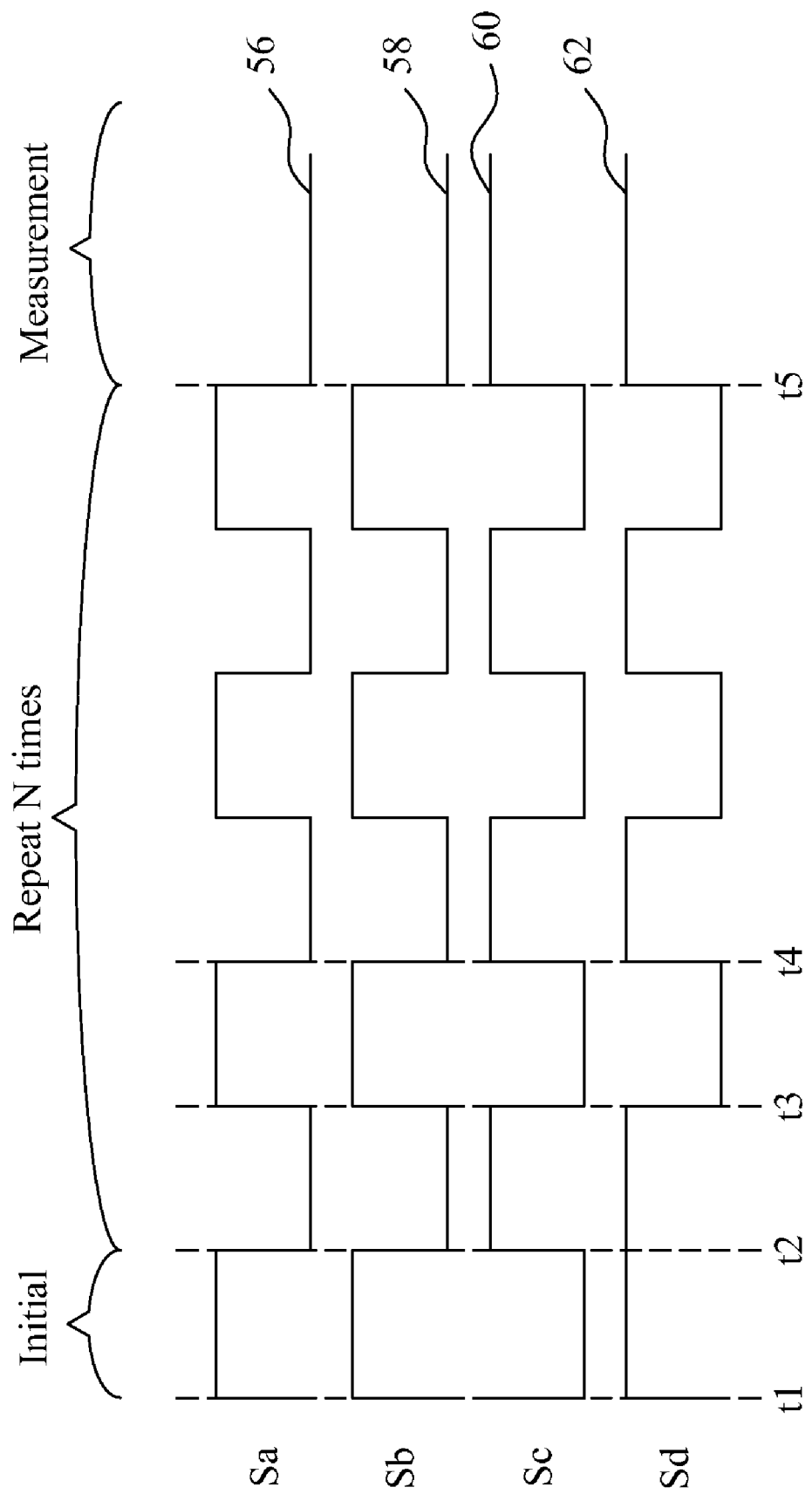
FIG. 6 is a timing diagram of the sensing circuit shown in FIG. 5.
Figure 7:
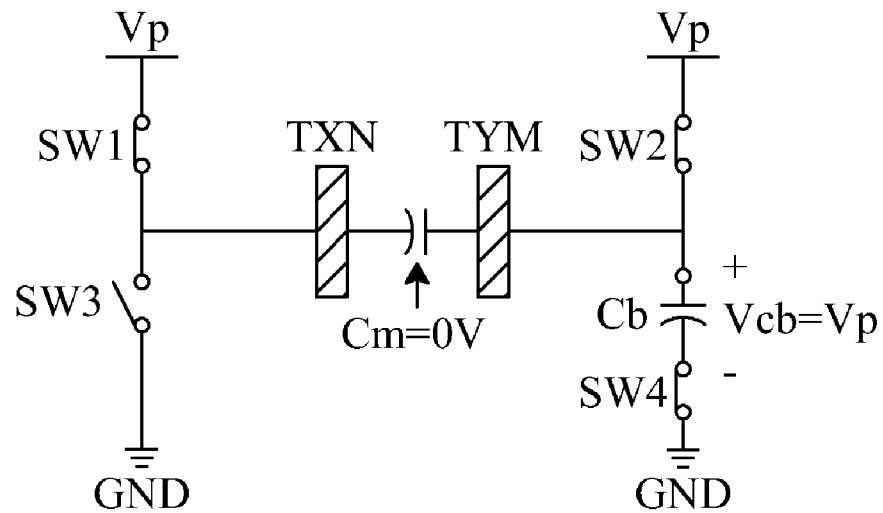
FIG. 7 is a first operating state of the sensing circuit shown in FIG. 5.
Figure 8:
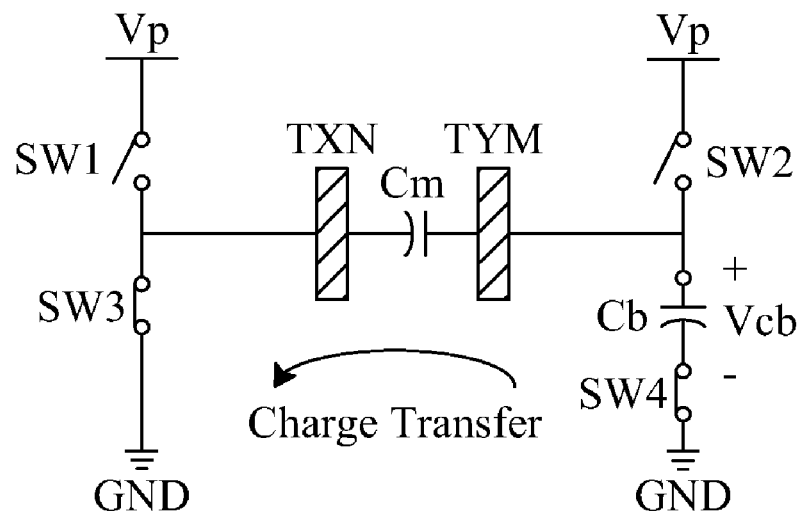
FIG. 8 is a second operating state of the sensing circuit shown in FIG. 5.
Figure 9:
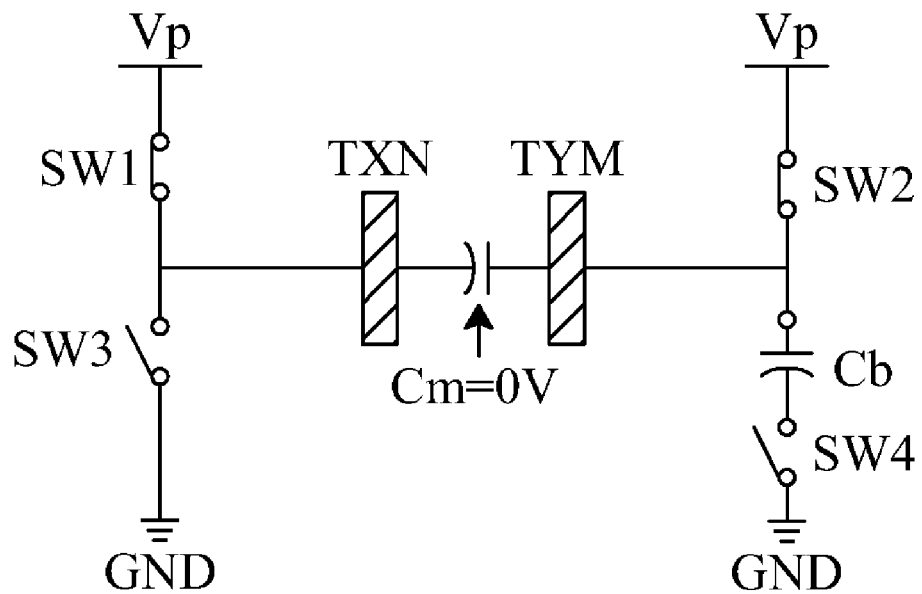
FIG. 9 is a third operating state of the sensing circuit shown in FIG. 5.

FIG. 6 is a timing diagram of the sensing circuit 50 shown in FIG. 5, in which waveform 56 represents the control signal Sa, waveform 58 represents the control signal Sb, waveform 60 represents the control signal Sc, and waveform 62 represents the control signal Sd. Operation of the sensing circuit 50 is now described with reference to FIGS. 5 to 9. First, the MCU 54 turns on the control signals Sa, Sb and Sd and turns off the control signal Sc, thus bringing the sensing circuit 50 into a first operating state. During this state, as between time t1 and time t2, the switches SW1, SW2 and SW4 are on, and the switch SW3 is off, as shown in FIG. 7. As a result, the source voltage Vp charges the measure capacitor Cb and the voltage Vcb of the measure capacitor Cb will increase to Vp, i.e., Vcb=Vp. Moreover, since the traces TXN and TYM are both connected to the voltage node Vp, the voltage across the mutual capacitor Cm is zero. At time t2, the MCU 54 turns on the control signals Sc and Sd and turns off the control signals Sa and Sb; therefore, the sensing circuit 50 enters a second operating state. During this state, as between time t2 and time t3, the switches SW1 and SW2 are off, and the switches SW3 and SW4 are on, as shown in FIG. 8. Consequently, the measure capacitor Cb charges the mutual capacitor Cm, and the charges in the measure capacitor Cb are partially transferred to the mutual capacitor Cm. After charge redistribution, the voltage Vcb of the measure capacitor Cb becomes Vp×Cb/(Cb+Cm), i.e., Vcb=Vp×Cb/(Cb+Cm). At time t3, the MCU 54 turns on the control signals Sa and Sb and turns off the control signals Sc and Sd, causing the sensing circuit 50 to enter a third operating state. During this state, as between time t3 and time t4, the switches SW1 and SW2 are on, and the switches SW3 and SW4 are off, as shown in FIG. 9. Since the traces TXN and TYM are both connected to the voltage node Vp, the charges in the mutual capacitor Cm will be released, and the voltage across the mutual capacitor Cm becomes zero.

Figure 10:
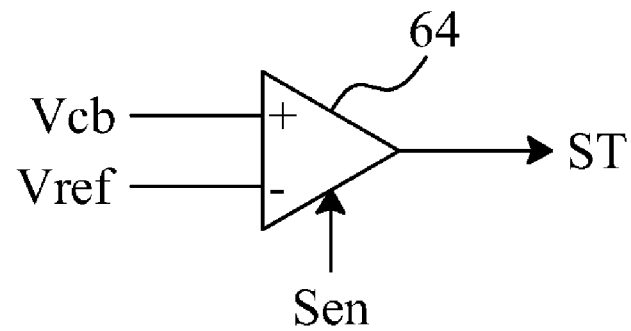
FIG. 10 is a circuit diagram of an embodiment for the measure unit shown in FIG. 5.

During the following period, as between time t4 and time t5, the MCU 54 switches the switches SW1, SW2, SW3 and SW4 several times such that the sensing circuit 50 repeats the two operating states shown in FIGS. 8 and 9. After the two operating states are repeated predetermined times, the sensing circuit 50 stays in the second operating state. Meanwhile, the MCU 54 triggers an enable signal Sen to enable the measure unit 53 to detect the voltage Vcb of the measure capacitor Cb. Finally, the measure unit 53 sends a sensing signal ST to the MCU 54 and the measure process is completed. When the intersection of the traces TXN and TYM is touched, the capacitance value of the mutual capacitor Cm is lowered and as a result, the amount of charges transferred from the measure capacitor Cb to the mutual capacitor Cm will be reduced. If the voltage Vcb of the measure capacitor Cb is higher than a reference voltage Vref, the measure unit 53 determines that the intersection is touched. FIG. 10 is a circuit diagram of an embodiment for the measure unit 53, which includes a comparator 64 for comparing the voltage Vcb with the reference voltage Vref. If the voltage Vcb is higher than the reference voltage Vref, the comparator 64 pulls high the sensing signal ST.

Figure 11:
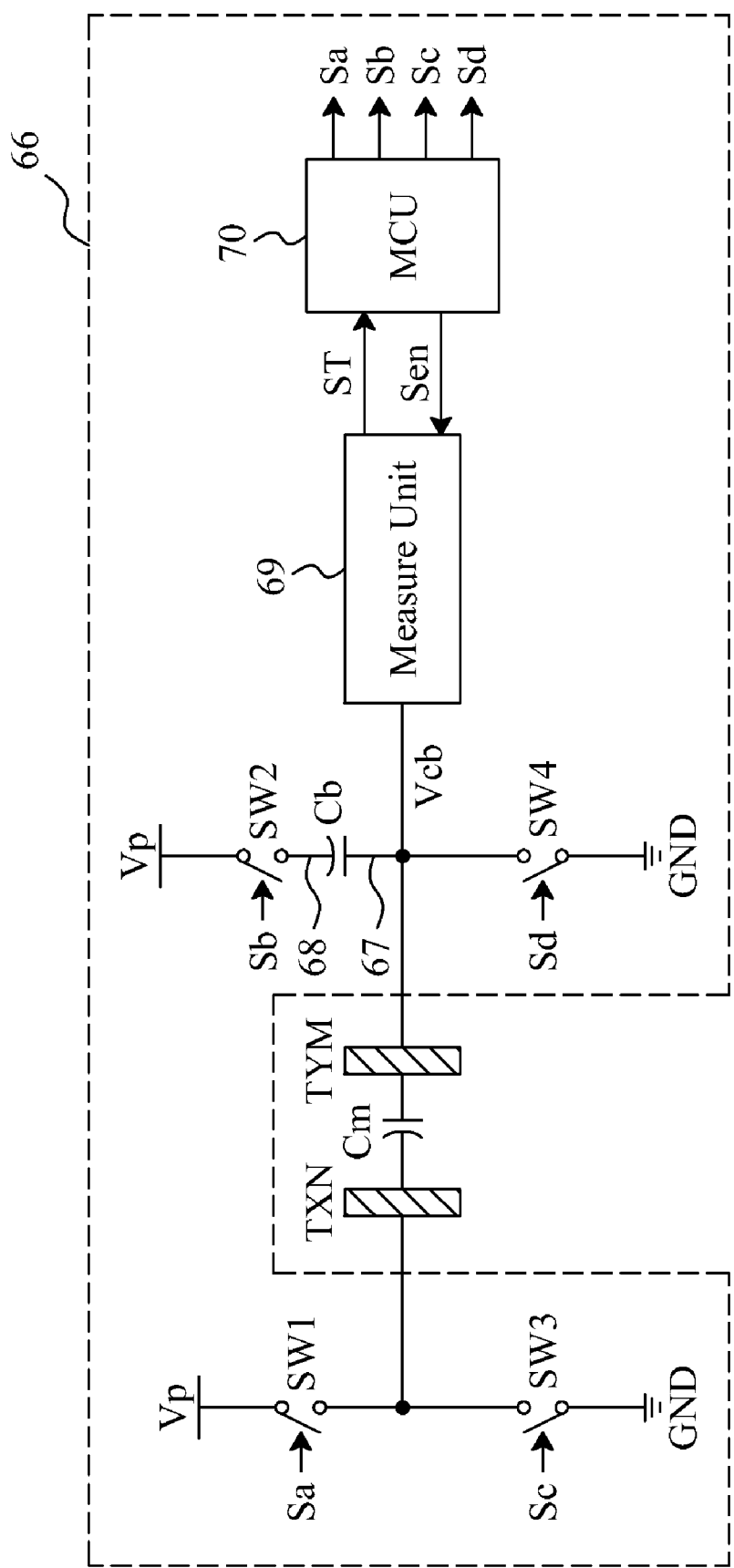
FIG. 11 is a circuit diagram of a second embodiment to carry out the sensing method according to the present invention.

FIG. 11 is a circuit diagram of a second embodiment to carry out the sensing method according to the present invention, in which a sensing circuit 66 is connected to traces TXN and TYM of a capacitive touch panel to detect the capacitance variation of the mutual capacitor Cm at the intersection of the traces TXN and TYM. The sensing circuit 66 includes switches SW1, SW2, SW3 and SW4, a measure capacitor Cb, a measure unit 69, and an MCU 70. The measure capacitor Cb has a first end 67 connected to the trace TYM, the switch SW1 is connected between a voltage node receiving a source voltage Vp and the trace TXN, the switch SW2 is connected between a second end 68 of the measure capacitor Cb and the voltage node Vp, the switch SW3 is connected between the trace TXN and a ground node GND, the switch SW4 is connected between the trace TYM and the ground node GND, the measure unit 69 is configured to detect the voltage Vcb of the measure capacitor Cb, and the MCU 70 provides control signals Sa, Sb, Sc and Sd for switching the switches SW1, SW2, SW3 and SW4, respectively.

Figure 12:
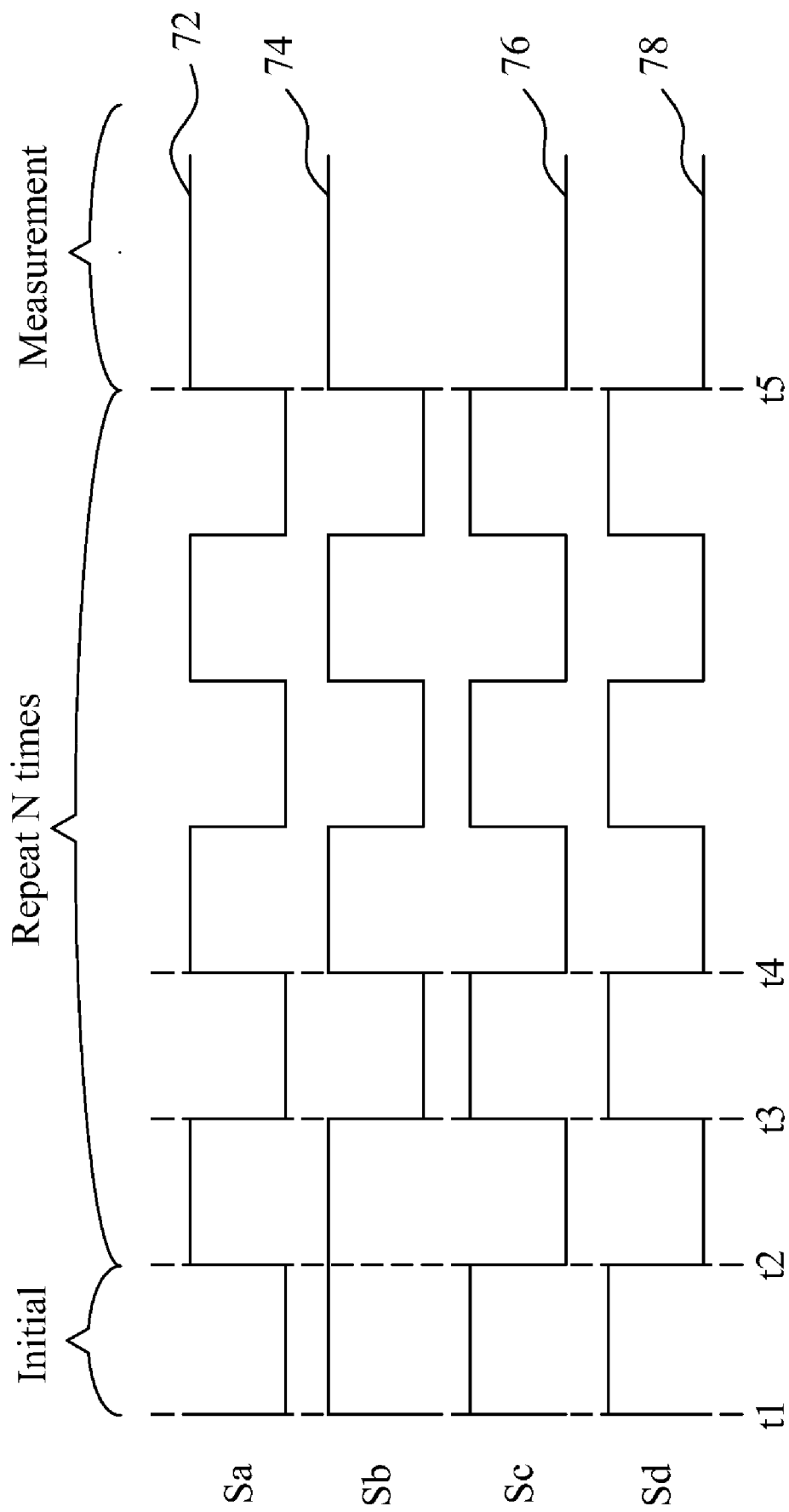
FIG. 12 is a timing diagram of the sensing circuit shown in FIG. 11.
Figure 13:
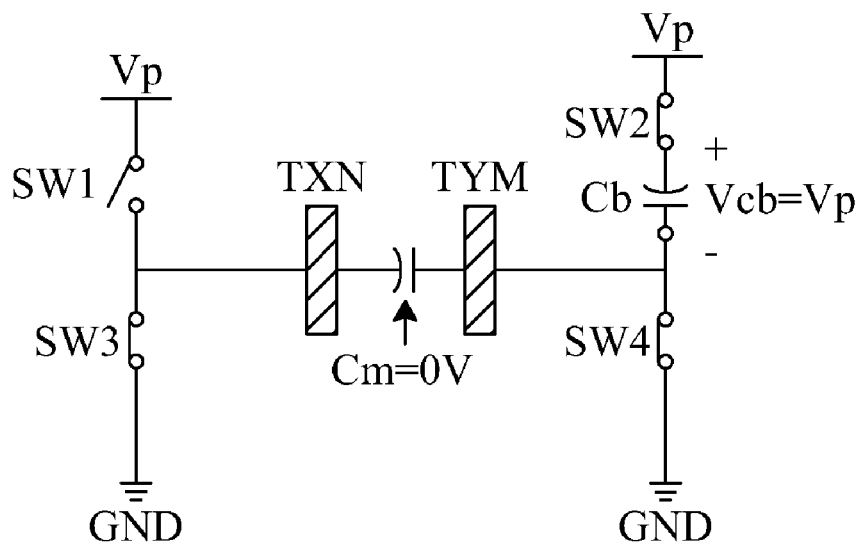
FIG. 13 is a first operating state of the sensing circuit shown in FIG. 11.
Figure 14:
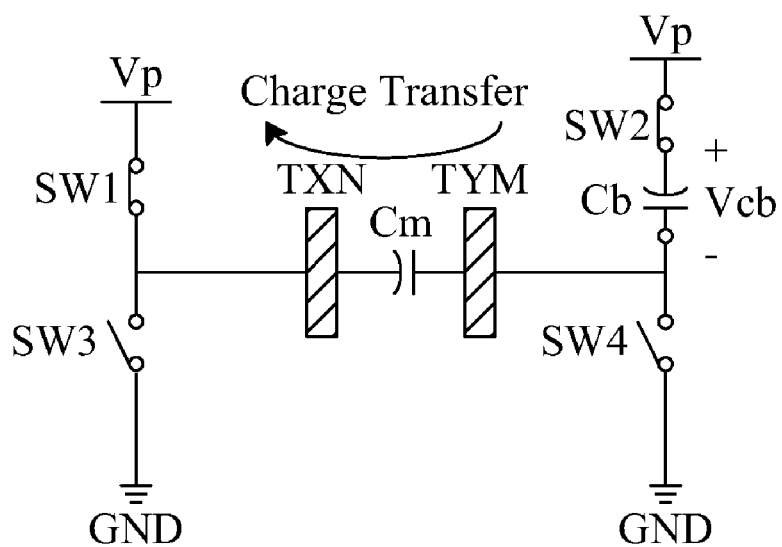
FIG. 14 is a second operating state of the sensing circuit shown in FIG. 11.
Figure 15:
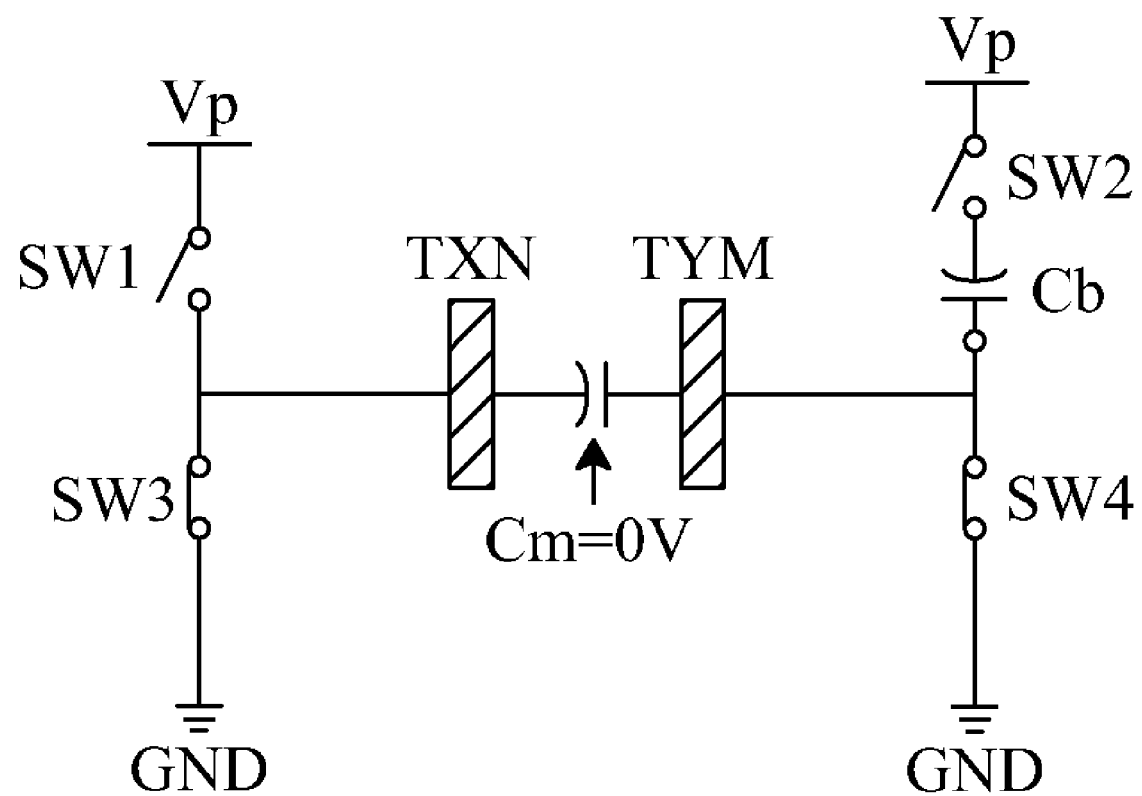
FIG. 15 is a third operating state of the sensing circuit shown in FIG. 11.

FIG. 12 is a timing diagram of the sensing circuit 66 shown in FIG. 11, in which waveform 72 represents the control signal Sa, waveform 74 represents the control signal Sb, waveform 76 represents the control signal Sc, and waveform 78 represents the control signal Sd. Operation of the sensing circuit 66 is described hereinafter with reference to FIGS. 11 to 15. Referring to FIGS. 11 and 12, at time T1, the MCU 70 turns on the control signals Sb, Sc and Sd and turns off the control signal Sa, so that the sensing circuit 66 enters a first operating state. During this state, as between time t1 and time t2, the switches SW2, SW3 and SW4 are on, and the switch SW1 is off, as shown in FIG. 13. Therefore, the source voltage Vp charges the measure capacitor Cb, and the voltage Vcb of the measure capacitor Cb increases to Vp, i.e., Vcb=Vp. Now that both the traces TXN and TYM are connected to the ground node GND, the voltage across the mutual capacitor Cm is zero. At time t2, the MCU 70 turns on the control signals Sa and Sb and turns off the control signals Sc and Sd, thereby bringing the sensing circuit 66 into a second operating state. During this state, as between time t2 and t3, the switches SW1 and SW2 are on, and the switches SW3 and SW4 are off, as shown in FIG. 14. As the measure capacitor Cb charges the mutual capacitor Cm, some of the charges in the measure capacitor Cb are transferred to the mutual capacitor Cm. After charges are redistributed between the measure capacitor Cb and the mutual capacitor Cm, the voltage Vcb of the measure capacitor Cb becomes Vp×Cb/(Cb+Cm), i.e., Vcb=Vp×Cb/(Cb+Cm). At time t3, the MCU 70 turns off the control signals Sa and Sb and turns on the control signals Sc and Sd, thus causing the sensing circuit 66 to enter a third operating state. During this state, as between t3 and t4, the switches SW1 and SW2 are off, and the switches SW3 and SW4 are on, as shown in FIG. 15. Since the traces TXN and TYM are both connected to the ground node GND, the charges in the mutual capacitor Cm are released, and the voltage across the mutual capacitor Cm is zero. During the time that follows, as between t4 and t5, the two operating states shown in FIGS. 14 and 15 are repeated. After the two operating states are repeated predetermined times, the sensing circuit 66 remains in the second operating state and the MCU 70 triggers an enable signal Sen to enable the measure unit 69 to detect the voltage Vcb of the measure capacitor Cb. Finally, the measure unit 69 sends a sensing signal ST to the MCU 70, and the measure process is completed.

Figure 16:
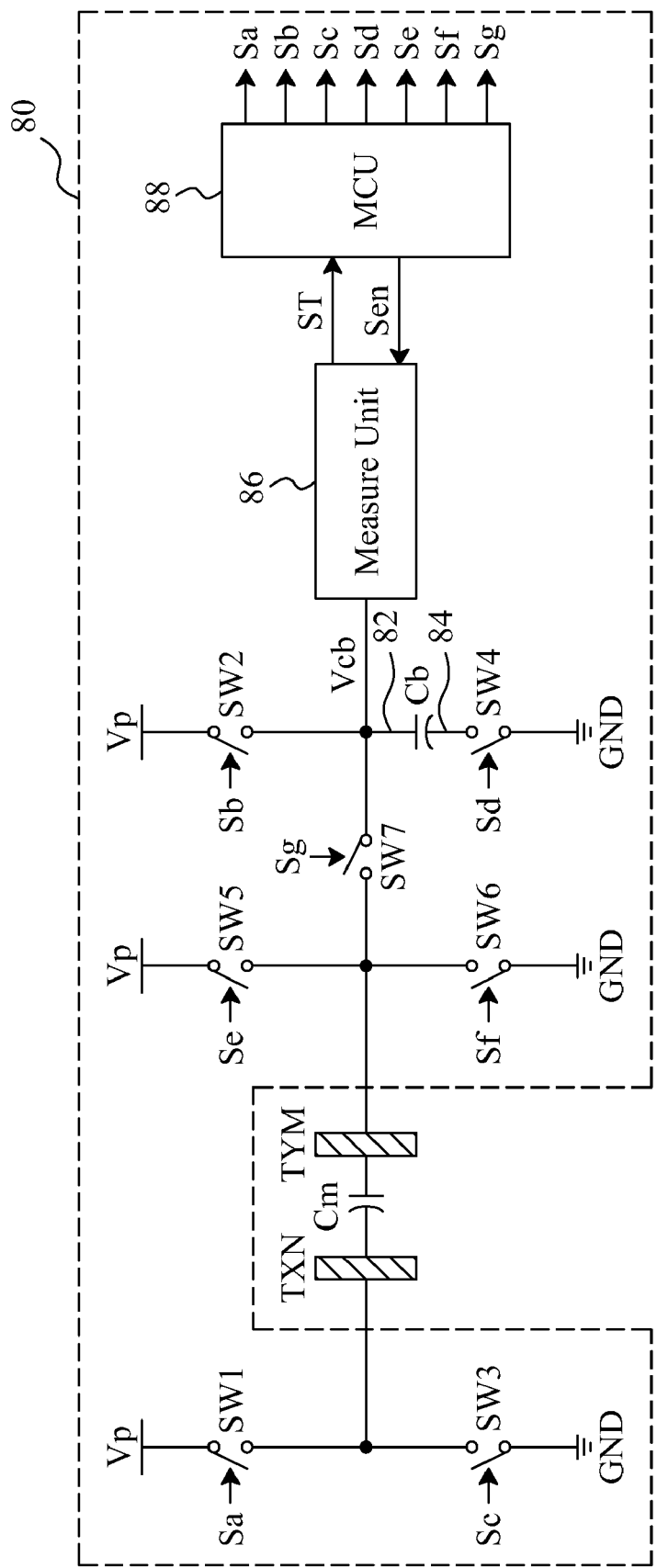
FIG. 16 is a circuit diagram of a third embodiment to carry out the sensing method according to the present invention.

FIG. 16 is a circuit diagram of a third embodiment to carry out the sensing method according to the present invention, in which a sensing circuit 80 is connected to traces TXN and TYM of a capacitive touch panel to detect the capacitance variation of the mutual capacitor Cm at the intersection of the traces TXN and TYM. The sensing circuit 80 includes switches SW1, SW2, SW3, SW4, SW5, SW6 and SW7, a measure capacitor Cb, a measure unit 86, and an MCU 88. The switch SW1 is connected between a voltage node receiving a source voltage Vp and the trace TXN, the switch SW2 is connected between the voltage node Vp and a first end 82 of the measure capacitor Cb, the switch SW3 is connected between the trace TXN and a ground node GND, the switch SW4 is connected between a second end 84 of the measure capacitor Cb and the ground node GND, the switch SW5 is connected between the voltage node Vp and the trace TYM, the switch SW6 is connected between the trace TYM and the ground node GND, the switch SW7 is connected between the trace TYM and the first end 82 of the measure capacitor Cb, the measure unit 86 is configured to detect the voltage Vcb of the measure capacitor Cb, and the MCU 88 provides control signals Sa, Sb, Sc, Sd, Se, Sf and Sg for switching the switches SW1 to SW7, respectively.

Figure 17:
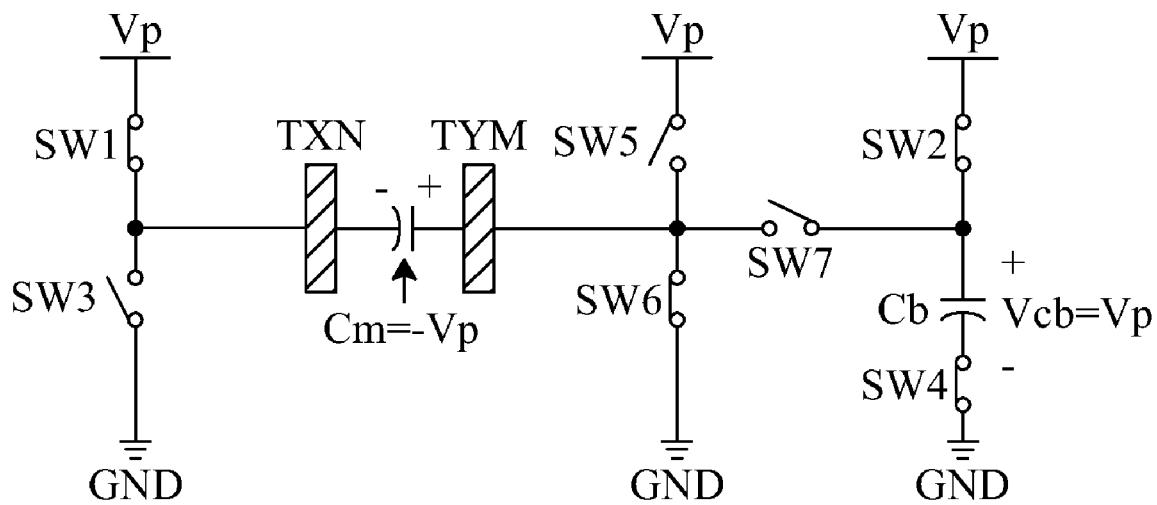
FIG. 17 is a first operating state of the sensing circuit shown in FIG. 16.
Figure 18:
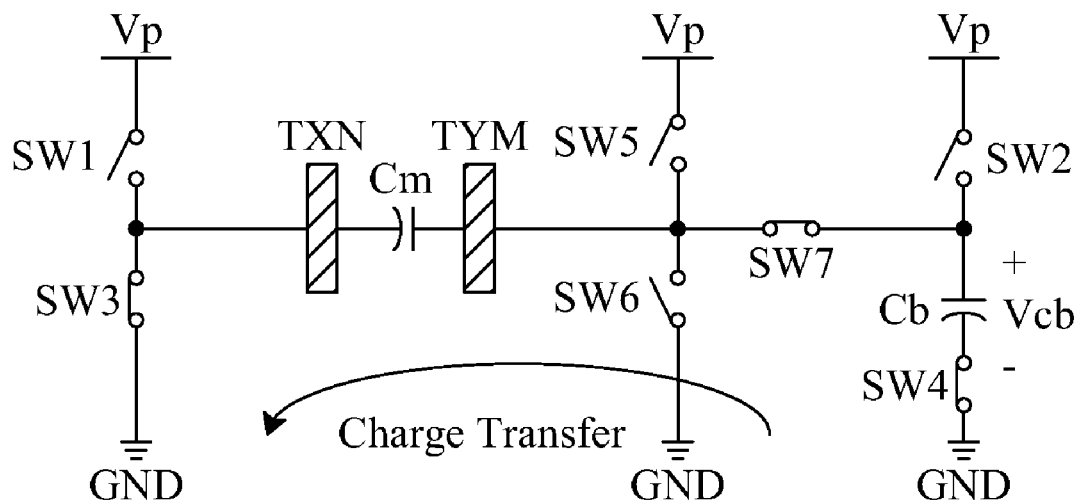
FIG. 18 is a second operating state of the sensing circuit shown in FIG. 16.
Figure 19:
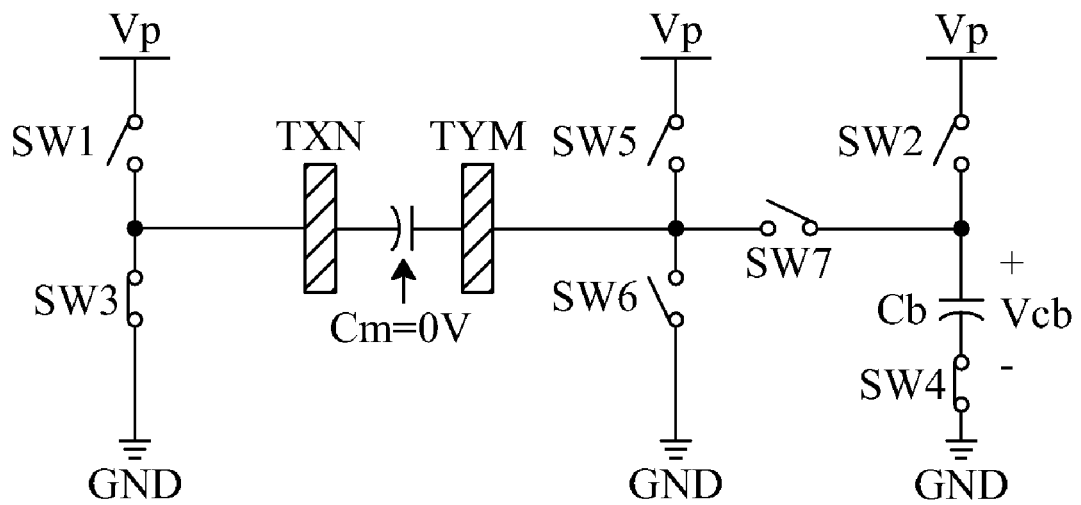
FIG. 19 is a third operating state of the sensing circuit shown in FIG. 16.

FIGS. 17 through 19 show operation of the sensing circuit 80. To begin with, the sensing circuit 80 enters a first operating state, during which time the switches SW1, SW2, SW4 and SW6 are on, and the switches SW3, SW5 and SW7 are off, as shown in FIG. 17. Consequently, the source voltage Vp charges the measure capacitor Cb and the voltage Vcb of the measure capacitor Cb increases to Vp, i.e., Vcb=Vp. As the trace TXN is connected to the voltage node Vp, and the trace TYM to the ground node GND, the voltage across the mutual capacitor Cm is −Vp. Then, the sensing circuit 80 enters a second operating state, during which time the switches SW3, SW4 and SW7 are on, and the switches SW1, SW2, SW5 and SW6 are off, as shown in FIG. 18. As the measure capacitor Cb charges the mutual capacitor Cm, some of the charges in the measure capacitor Cb are transferred to the mutual capacitor Cm. After charges are redistributed between the measure capacitor Cb and the mutual capacitor Cm, the voltage Vcb of the measure capacitor Cb becomes Vp×(Cb−Cm)/(Cb+Cm), i.e., Vcb=Vp×(Cb−Cm)/(Cb+Cm). Then, the sensing circuit 80 enters a third operating state either directly or after repeating the first and second operating states at least once. During the third operating state, as shown in FIG. 19, the switches SW3 and SW4 are on, and the switches SW1, SW2, SW5, SW6 and SW7 are off. The MCU 88 triggers an enable signal Sen to enable the measure unit 86 to detect the voltage Vcb of the measure capacitor Cb and thereby determines whether or not the capacitance value of the mutual capacitor Cm has changed. Finally, the measure unit 86 sends a sensing signal ST to the MCU 88 and the measure process is completed.

Figure 20:
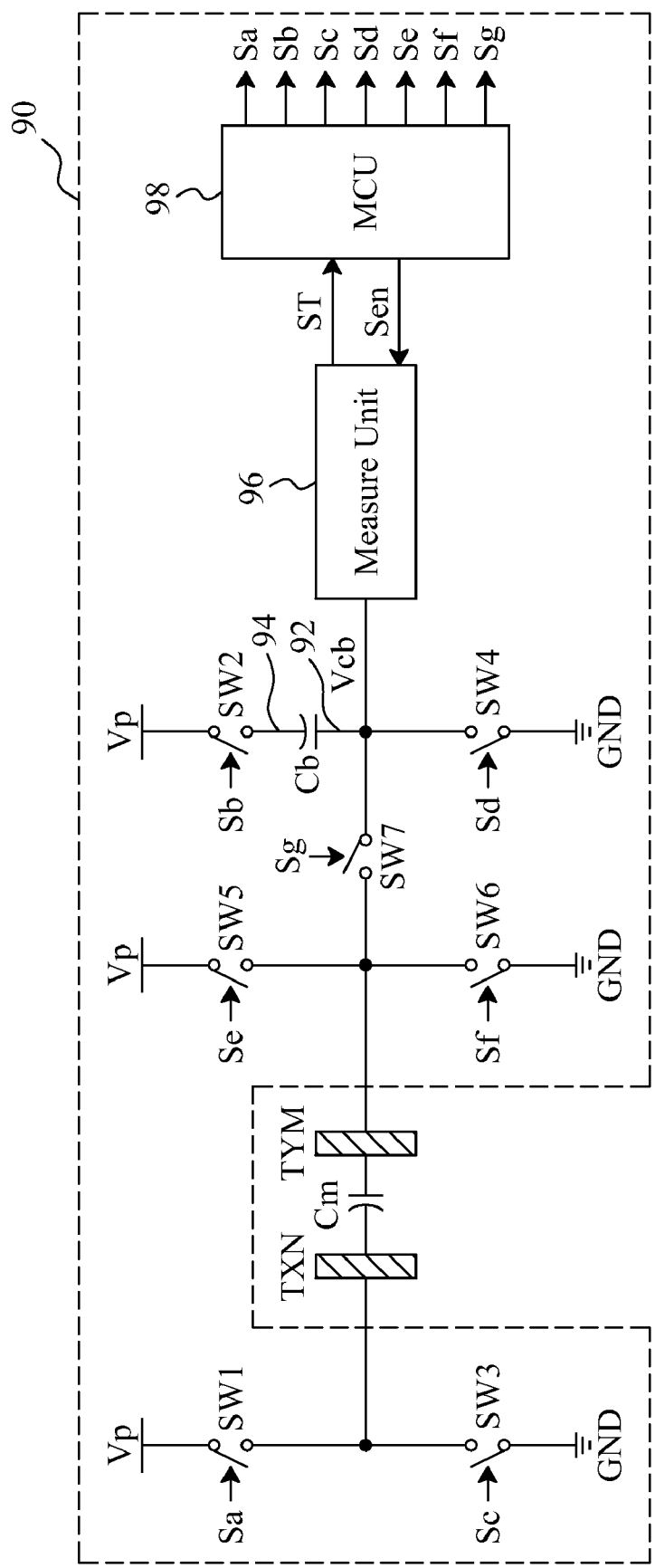
FIG. 20 is a circuit diagram of a fourth embodiment to carry out the sensing method according to the present invention.

FIG. 20 is a circuit diagram of a fourth embodiment to carry out the sensing method according to the present invention, in which a sensing circuit 90 is connected to traces TXN and TYM of a capacitive touch panel to detect the capacitance variation of the mutual capacitor Cm at the intersection of the traces TXN and TYM. The sensing circuit 90 includes switches SW1, SW2, SW3, SW4, SW5, SW6 and SW7, a measure capacitor Cb, a measure unit 96, and an MCU 98. The switch SW1 is connected between a voltage node receiving a source voltage Vp and the trace TXN, the switch SW2 is connected between the voltage node Vp and a second end 94 of the measure capacitor Cb, the switch SW3 is connected between the trace TXN and a ground node GND, the switch SW4 is connected between a first end 92 of the measure capacitor Cb and the ground node GND, the switch SW5 is connected between the voltage node Vp and the trace TYM, the switch SW6 is connected between the trace TYM and the ground node GND, the switch SW7 is connected between the trace TYM and the first end 92 of the measure capacitor Cb, the measure unit 96 is configured to detect the voltage Vcb of the measure capacitor Cb to generate a sensing signal ST, and the MCU 98 provides controls signals Sa, Sb, Sc, Sd, Se, Sf and Sg for switching the switches SW1 to SW7, respectively.

Figure 21:
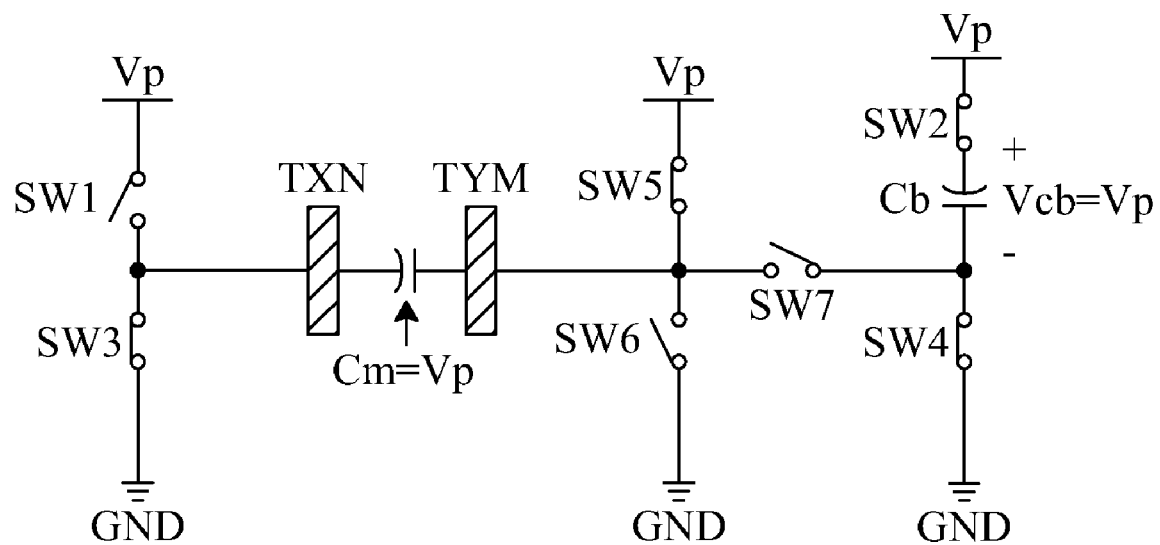
FIG. 21 is a first operating state of the sensing circuit shown in FIG. 20.
Figure 22:
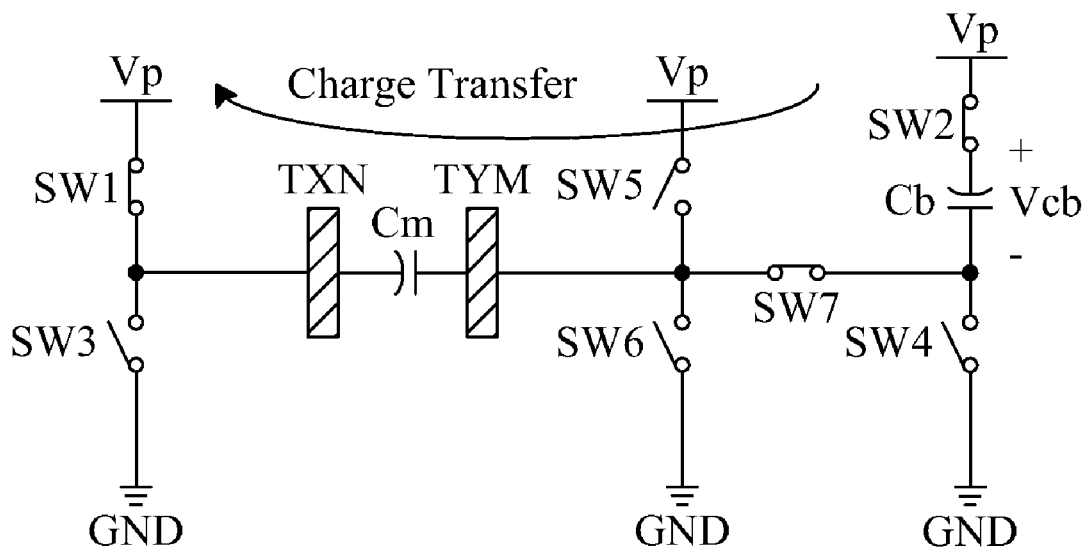
FIG. 22 is a second operating state of the sensing circuit shown in FIG. 20.
Figure 23:
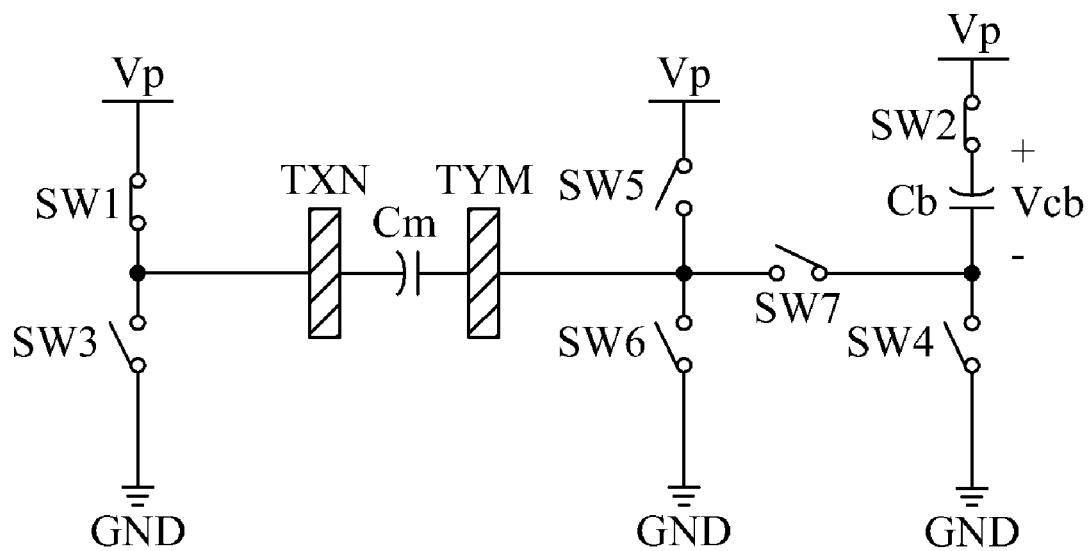
FIG. 23 is a third operating state of the sensing circuit shown in FIG. 20.

FIGS. 21 to 23 show operation of the sensing circuit 90. To start with, the sensing circuit 90 enters a first operating state, during which time the switches SW2, SW3, SW4 and SW5 are on, and the switches SW1, SW6 and SW7 are off, as shown in FIG. 21. Thus, the source voltage Vp charges the measure capacitor Cb and the voltage Vcb of the measure capacitor Cb increases to Vp, i.e., Vcb=Vp. As the trace TXN is connected to the ground node GND, and the trace TYM to the voltage node Vp, the voltage across the mutual capacitor Cm is Vp. Then, the sensing circuit 90 enters a second operating state, during which time the switches SW1, SW2 and SW7 are on, and the switches SW3, SW4, SW5 and SW6 are off, as shown in FIG. 22. Since the measure capacitor Cb is connected to the mutual capacitor Cm, the charges in the measure capacitor Cb and in the mutual capacitor Cm are redistributed therebetween; therefore, the voltage Vcb of the measure capacitor Cb becomes Vp×(Cb−Cm)/(Cb+Cm), i.e., Vcb=Vp×(Cb−Cm)/(Cb+Cm). Afterward, the sensing circuit 90 enters a third operating state either directly or after repeating the first and second operating states at least once. During the third operating state, as shown in FIG. 23, the switches SW1 and SW2 are on, and the switches SW3, SW4, SW5, SW6 and SW7 are off. At the same time, the MCU 98 triggers an enable signal Sen to enable the measure unit 96 to detect the voltage Vcb of the measure capacitor Cb and determine accordingly whether or not the capacitance value of the measure capacitor Cm has changed. Finally, the measure unit 96 sends a sensing signal ST to the MCU 98, and the measure process is completed.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A sensing circuit for a capacitive touch panel including a first trace and a second trace with a mutual capacitor at an intersection thereof, the sensing circuit comprising:
   a measure capacitor having a first end and a second end, the first end of the measure capacitor directly connected to the second trace;
   a first switch connected directly between a first voltage node and the first trace;
   a second switch directly connected between the first voltage node and the second trace;
   a third switch directly connected between the first trace and a second voltage node;
   a fourth switch directly connected between the second end of the measure capacitor and the second voltage node;
   a measure unit directly connected to the measure capacitor, operative to determine whether or not the intersection is touched according to a voltage of the measure capacitor; and
   a control unit connected to the first, second, third and fourth switches, operative to switch the first, second, third and fourth switches.

2. The sensing circuit of claim 1, wherein the measure unit determines that the intersection is touched, if the voltage of the measure capacitor is higher than a reference voltage.

3. The sensing circuit of claim 2, wherein the measure unit comprises a comparator for comparing the voltage of the measure capacitor with the reference voltage.

4. The sensing circuit of claim 1, wherein the control unit triggers an enable signal to enable the measure unit to detect the voltage of the measure capacitor.

5. The sensing circuit of claim 1, wherein the control unit turns on the first, second and fourth switches and turns off the third switch in a first operating state; turns on the third and fourth switches and turns off the first and second switches in a second operating state; and turns on the first and second switches and turns off the third and fourth switches in a third operating state.

6. A sensing circuit for a capacitive touch panel including a first trace and a second trace with a mutual capacitor at an intersection thereof, the sensing circuit comprising:
   a measure capacitor having a first end and a second end;
   a first switch directly connected between a first voltage node and the first trace;
   a second switch directly connected between the first voltage node and the first end of the measure capacitor;
   a third switch directly connected between the first trace and a second voltage node;
   a fourth switch directly connected between the second end of the measure capacitor and the second voltage node;
   a fifth switch directly connected between the first voltage node and the second trace;
   a sixth switch directly connected between the second trace and the second voltage node;
   a seventh switch directly connected between the second trace and the first end of the measure capacitor;
   a measure unit directly connected to the measure capacitor, operative to determine whether or not the intersection is touched according to a voltage of the measure capacitor; and
   a control unit connected to the first, second, third, fourth, fifth, sixth and seventh switches, operative to switch the first, second, third, fourth, fifth, sixth and seventh switches.

7. The sensing circuit of claim 6, wherein the control unit triggers an enable signal to enable the measure unit to detect the voltage of the measure capacitor.

8. The sensing circuit of claim 6, wherein the control unit turns on the first, second, fourth and sixth switches and turns off the third, fifth and seventh switches in a first operating state; turns on the third, fourth and seventh switches and turns off the first, second, fifth and sixth switches in a second operating state; and turns on the third and fourth switches and turns off the first, second, fifth, sixth and seventh switches in a third operating state.

* * * * *